(12) United States Patent
Cao et al.

(10) Patent No.: US 9,287,397 B2
(45) Date of Patent: Mar. 15, 2016

(54) SEMICONDUCTOR DEVICE AND METHOD OF FABRICATING SAME

(71) Applicant: Semiconductor Manufacturing International Corporation (Shanghai), Shanghai (CN)

(72) Inventors: GuoHao Cao, Shanghai (CN); Guangli Yang, Shanghai (CN); Yang Zhou, Shanghai (CN); GangNing Wang, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 54 days.

(21) Appl. No.: 13/947,911

(22) Filed: Jul. 22, 2013

(65) Prior Publication Data

US 2014/0145267 A1 May 29, 2014

(30) Foreign Application Priority Data

Nov. 23, 2012 (CN) .......................... 2012 1 0483778

(51) Int. Cl.
*H01L 29/66* (2006.01)
*H01L 29/78* (2006.01)
*H01L 21/768* (2006.01)

(52) U.S. Cl.
CPC ...... *H01L 29/7831* (2013.01); *H01L 21/76895* (2013.01); *H01L 21/76897* (2013.01)

(58) Field of Classification Search
CPC .................. H01L 29/4983; H01L 21/28105; H01L 21/28247; H01L 29/6656; H01L 21/28088; H01L 29/7831; H01L 21/768; H01L 21/76885; H01L 21/76834; H01L 21/76895; H01L 21/76897; H01L 27/10888
USPC .................. 257/210, E21.657, E21.658, 365; 438/765, 229, 197, 587, 666, 597, 596, 438/598, 588, 259
See application file for complete search history.

(56) References Cited

U.S. PATENT DOCUMENTS

| | | | |
|---|---|---|---|
| 5,668,065 A * | 9/1997 | Lin | 438/303 |
| 5,763,303 A * | 6/1998 | Liaw et al. | 438/210 |
| 5,913,139 A * | 6/1999 | Hashimoto et al. | 438/618 |
| 6,107,175 A * | 8/2000 | Lin et al. | 438/586 |
| 6,171,954 B1 * | 1/2001 | Hsu | 438/656 |
| 6,200,854 B1 * | 3/2001 | Chuang | 438/253 |
| 6,218,241 B1 * | 4/2001 | Chuang | 438/253 |
| 6,780,739 B1 * | 8/2004 | Mao et al. | 438/586 |
| 2004/0201043 A1* | 10/2004 | Mao et al. | 257/208 |
| 2007/0178642 A1* | 8/2007 | Kim et al. | 438/244 |
| 2008/0227290 A1* | 9/2008 | Bae | 438/653 |

(Continued)

*Primary Examiner* — Latanya N Crawford
(74) *Attorney, Agent, or Firm* — Innovation Counsel LLP

(57) ABSTRACT

A semiconductor device and method of fabricating the semiconductor device are disclosed. The method includes forming a plurality of gate electrodes at a predetermined interval on a surface of a semiconductor substrate, forming spacers on sidewalls of the gate electrodes, depositing an interconnection layer conformally on the surface of the semiconductor substrate over the gate electrodes and the spacers, selectively etching the interconnection layer, wherein at least a portion of the interconnection layer that is formed on the surface of the semiconductor substrate and sidewalls of the spacers and located between adjacent gate electrodes remains after the selective etch, and forming an electrical contact on the etched interconnection layer located between the adjacent gate electrodes.

12 Claims, 6 Drawing Sheets

(56) References Cited

U.S. PATENT DOCUMENTS

| | | | |
|---|---|---|---|
| 2008/0268640 A1* | 10/2008 | Fang et al. | 438/672 |
| 2009/0108379 A1* | 4/2009 | Oosuka et al. | 257/412 |
| 2010/0148283 A1* | 6/2010 | Shih | 257/415 |
| 2012/0068232 A1* | 3/2012 | Kim | 257/265 |

* cited by examiner

SEMICONDUCTOR DEVICE AND METHOD OF FABRICATING SAME

CROSS-REFERENCE TO RELATED APPLICATIONS

This application claims priority under 35 U.S.C. §119 to Chinese Patent Application No. 201210483778.3, filed on Nov. 23, 2012 and entitled "SEMICONDUCTOR DEVICE AND METHOD OF FABRICATING SAME", which is incorporated herein by reference in its entirety.

FIELD OF THE INVENTION

The present invention relates to semiconductors, and more particularly, to a semiconductor device and method of fabricating the same.

DESCRIPTION OF THE RELATED ART

Further miniaturization of semiconductor devices and integration of ICs (Integrated Circuits) can increase performance of the semiconductor devices and ICs. However, the miniaturization of semiconductor devices poses scaling challenges, particularly in the fabrication of the semiconductor devices. The scaling challenges will be briefly described with reference to FIG. 1, which shows a cross-sectional view of a metal oxide semiconductor (MOS) device in the related art.

As shown in FIG. 1, a MOS 10 includes a semiconductor substrate 100 and gate electrodes 115 formed above a surface of the semiconductor substrate 100, with a gate insulating film 105 formed between each gate electrode 115 and the semiconductor substrate 100. The MOS 10 further includes spacers 110 formed on sidewalls of the gate electrodes 115, and a dielectric layer 160 formed above the gate electrodes 115. Contact holes 165 are formed in the dielectric layer 160 and filled with plug 170 (for example, a tungsten plug). Additionally, a conductive layer, such as a Ti or TiN film, may be formed on the sidewalls and bottom of the contact holes 165 prior to filling the contact holes 165 with the plug 170. Each contact hole 165 and corresponding plug 170 (and the conductive layer, if present) collectively constitutes an electrical contact.

As further shown in FIG. 1, the bottom surface of each contact hole 165 is in contact with a surface of an interconnection layer 125. The interconnection layer 125, in turn, is formed on a surface of the semiconductor substrate 100 and the gate electrodes 115.

In semiconductor device scaling, it is desirable to increase device density by increasing the number of devices within a given area. This may be achieved, for example, by reducing the gate-to-gate distance (i.e., the distance between adjacent gate electrodes 115) or the size (width) of the electrical contact. However, as shown in FIG. 1, the electrical contact (formed by the contact hole 165 and the plug 170) is located between adjacent gate electrodes 115, and coupled to the interconnection layer 125 formed on the surface of the semiconductor substrate 100. As a result, the size of the electrical contact has to be considered when designing the gate-to-gate distance of a semiconductor device (for example, MOS 10). Otherwise, reductions in the gate-to-gate distance without corresponding adjustments to the size of the electrical contact may lead to electrical shorts between adjacent gate electrodes 115 and/or premature device failures. In particular, the size of the gate spacers (for example, spacers 110), size of the electrical contact, and contact-to-active area design rules can limit the gate-to-gate distance in the structure of a MOS device, thereby impacting device scaling.

SUMMARY

The present disclosure is directed to address at least the above device scaling challenges in the related art.

According to some embodiments of the inventive concept, a method of fabricating a semiconductor device is provided. The method includes forming a plurality of gate electrodes at a predetermined interval on a surface of a semiconductor substrate, forming spacers on sidewalls of the gate electrodes, depositing an interconnection layer conformally on the surface of the semiconductor substrate over the gate electrodes and the spacers, selectively etching the interconnection layer, wherein at least a portion of the interconnection layer that is formed on the surface of the semiconductor substrate and sidewalls of the spacers and located between adjacent gate electrodes remains after the selective etch, and forming an electrical contact on the etched interconnection layer located between the adjacent gate electrodes.

According to some other embodiments of the inventive concept, a method of fabricating a semiconductor device is provided. The method includes forming a plurality of gate electrodes at a predetermined interval on a surface of a semiconductor substrate, forming a first hard mask layer on a surface of the gate electrodes, forming spacers on sidewalls of the gate electrodes, depositing an interconnection layer conformally on the surface of the semiconductor substrate over the first hard mask layer, the gate electrodes, and the spacers, selectively etching the interconnection layer, wherein a portion of the interconnection layer and a portion of the hard mask layer located above adjacent gate electrodes remain after the selective etch, and a portion of the interconnection layer that is formed on the surface of the semiconductor substrate and sidewalls of the spacers and located between the adjacent gate electrodes remains after the selective etch, and forming an electrical contact on the etched interconnection layer located between the adjacent gate electrodes.

According to some embodiments of the inventive concept, a semiconductor device is provided. The semiconductor device includes a plurality of gate electrodes formed on a surface of a semiconductor substrate at a predetermined interval, with spacers formed on sidewalls of the gate electrodes, an interconnection layer deposited conformally on the surface of the semiconductor substrate over the gate electrodes and the spacers and located between adjacent gate electrodes, and an electrical contact formed on the interconnection layer.

According to some other embodiments of the inventive concept, a semiconductor device is provided. The semiconductor device includes a plurality of gate electrodes formed on a surface of a semiconductor substrate at a predetermined interval, with spacers formed on sidewalls of the gate electrodes, an interconnection layer deposited conformally on the surface of the semiconductor substrate over the gate electrodes and the spacers and located between adjacent gate electrodes, an insulating layer formed between the interconnection layer and a surface of the gate electrodes, and an electrical contact formed on the interconnection layer.

In some embodiments, the first hard mask layer may be used as an etch stop layer during the selective etching of the interconnection layer.

In some embodiments, the first hard mask layer may be formed of a nitride, an oxide, or an oxynitride.

In some embodiments, a second hard mask layer may be formed on the interconnection layer, wherein the second hard mask layer is completely removed after the selective etching of the interconnection layer.

In some embodiments, the second hard mask layer may be formed of a nitride, an oxide, or an oxynitride.

In some embodiments, the interconnection layer may be formed of a metal or polysilicon.

In some embodiments, the interconnection layer may have a thickness of about 300~400 Å.

In some embodiments, the semiconductor device may be a metal oxide semiconductor (MOS) transistor.

BRIEF DESCRIPTION OF THE DRAWINGS

The following detailed description of some embodiments of the inventive concept will be more clearly understood when read in conjunction with the appended drawings. It should be understood, however, that the embodiments are not limited to the arrangements and instrumentalities as shown. In the drawings, like numerals are used to indicate like elements throughout. Furthermore, other desirable features and characteristics will become apparent from the subsequent detailed description and the appended claims, in view of the accompanying drawings and the foregoing technical field and background.

For simplicity and clarity of illustration, the drawings illustrate the general manner of construction, and descriptions and details of well-known features and techniques may be omitted to avoid unnecessarily obscuring aspects of the illustrated embodiments. Additionally, the elements in the drawings may not be drawn to scale.

DESCRIPTION OF THE EMBODIMENTS

The detailed description set forth below with reference to the appended drawings is intended to be a description of some embodiments of the inventive concept. It is to be understood that the same or equivalent functions may be accomplished by different embodiments.

The terms "first", "second", and other such terms in the description and the claims, if present, are used to distinguish between similar elements. The terms do not necessarily prescribe a particular sequence or chronological order. It is to be understood that the terms as used are interchangeable under appropriate circumstances such that the embodiments described herein can be used in sequences other than those illustrated or otherwise described. Furthermore, the terms "comprise," "include," "have" and any variations thereof, are intended to cover non-exclusive inclusions, such that a process, method, article, or apparatus that comprises, includes, or has a list of elements is not necessarily limited to those elements, but may include other elements not expressly listed or inherent to such process, method, article, or apparatus.

Below, a semiconductor device and method of fabricating the semiconductor device according to an embodiment of the inventive concept will be described with reference to FIGS. 2-6.

Figure 2:
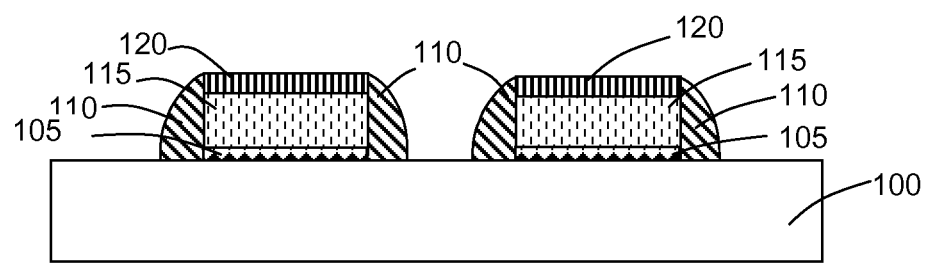
FIGS. 2-6 are cross-section views of a semiconductor device at various stages of fabrication according to an embodiment of the inventive concept.

Referring to FIG. 2, a semiconductor substrate 100 (for example, a silicon substrate) is provided. Gate electrodes 115 may be formed on a surface of the semiconductor substrate 100 using known deposition techniques such as Chemical Vapor Deposition (CVD). An insulating film 105 may be formed between the gate electrodes 115 and the semiconductor substrate 100. The insulating film 105 may be formed of, for example, silicon oxide, silicon nitride, or silicon oxynitride.

As shown in FIG. 2, a first hard mask layer 120 is formed on a surface of the gate electrodes 115, and spacers 110 are formed on the sidewalls of the gate electrodes 115. The first hard mask layer 120 may be formed of, for example, a nitride, an oxide, or an oxynitride. In some embodiments, the first hard mask layer 120 is formed of silicon oxynitride.

In some embodiments, the first hard mask layer 120 may be used as an etch stop layer.

In some other embodiments, the first hard mask layer 120 may be omitted. However, omission of the first hard mask layer 120 may lead to stricter process requirements (for example, in terms of alignment/etch accuracy).

Figure 3:
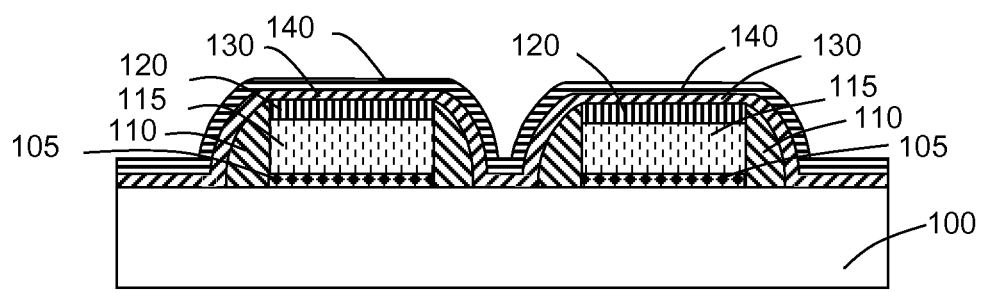

Next, as shown in FIG. 3, an interconnection layer 130 is deposited conformally on the semiconductor substrate 100 over the first hard mask layer 120, gate electrodes 115, and spacers 110. The interconnection layer 130 may be formed of a conductive material, for example, a metal or a semiconductor material. In some embodiments, the interconnection layer 130 is formed of polysilicon. In order to deposit a continuous conformal film, the interconnection layer 130 should be thin, preferably having a thickness of about 300~400 Å.

Referring to FIG. 3, a second hard mask layer 140 is deposited conformally on the interconnection layer 130. The second hard mask layer 140 may be formed of, for example, a nitride, an oxide, or an oxynitride. In some embodiments, the second hard mask layer 140 is formed of silicon oxynitride.

Figure 4:
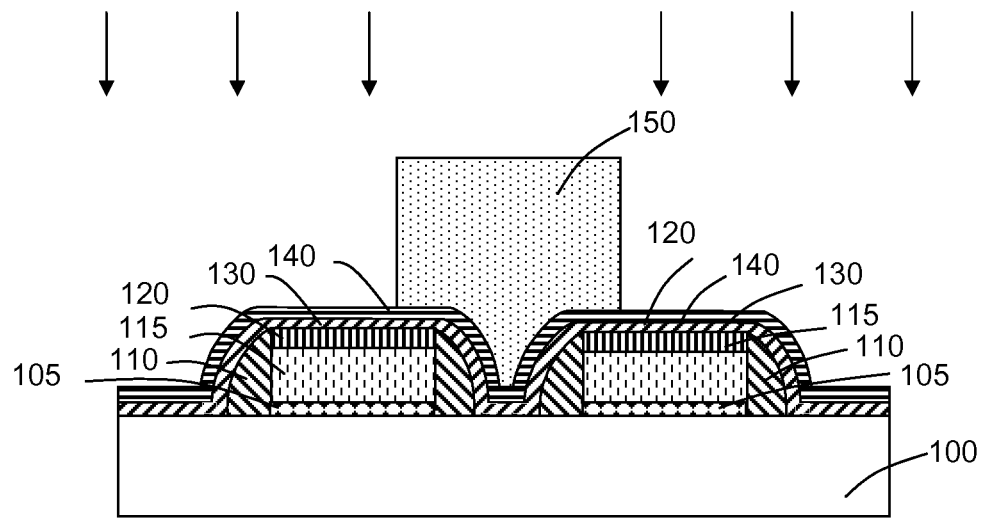
Figure 5:
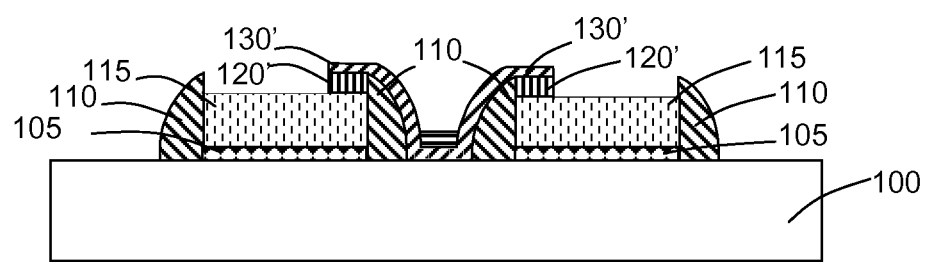

With reference to FIGS. 4 and 5, the interconnection layer 130 is selectively etched such that a portion of the interconnection layer 130 and a portion of the first hard mask layer 120 located above adjacent gate electrodes 115 remain after the selective etch. In addition, a portion of the interconnection layer 130 that is formed on the surface of the semiconductor substrate 100 and the sidewalls of the spacers 110 and located between adjacent gate electrodes 115, also remains after the selective etch.

With reference to FIG. 4, a layer of photoresist is first coated over the semiconductor substrate 100 and photolithography (denoted by the arrows in FIG. 4) is then performed. FIG. 4 shows a residual photoresist 150 remaining after the photolithography.

Next, referring to FIG. 5, the interconnection layer 130 is selectively etched using the residual photoresist 150 as an etch mask. The interconnection layer 130 may be selectively etched, for example, using dry etching or wet etching. As shown in FIG. 5, the selective etching results in the complete removal of the second hard mask layer 140, while a portion of the interconnection layer 130 and a portion of the first hard mask 120 located above adjacent gate electrodes 115 remain after the selective etch. As previously described, a portion of the interconnection layer 130 that is formed on the surface of the semiconductor substrate 100 and the sidewalls of the spacers 110 and located between adjacent gate electrodes 115, also remains after the selective etch.

Referring to FIG. 5, the portion of the interconnection layer 130 and the portion of the first hard mask layer 120 remaining after the selective etch are denoted as 130' and 120', respectively. In some embodiments, the etched first hard mask layer 120' can provide an insulating function to prevent electrical shorts between the gate electrodes 115 and the etched interconnection layer 130'.

In some embodiments, the interconnection layer 130 may be selectively etched to completely remove the first hard mask layer 120 and the second hard mask layer 140, while at least a portion of the interconnection layer 130 that is formed on the surface of the semiconductor substrate 100 and the sidewalls of the spacers 110 and located between adjacent gate electrodes 115, remains after the selective etch. (see, e.g., FIG. 7)

Figure 6:
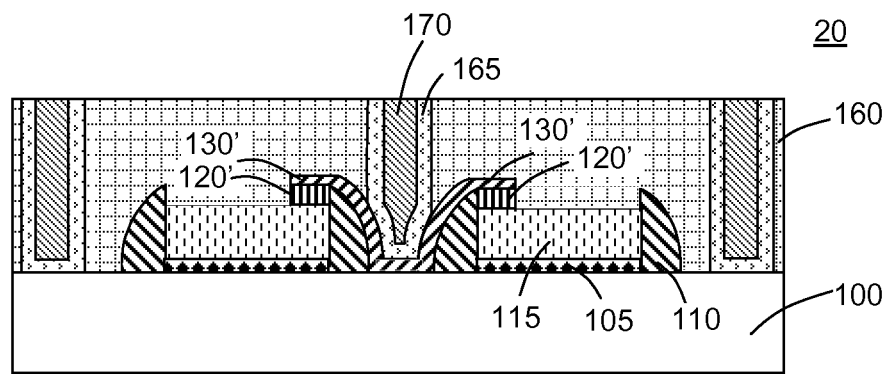

Next, with reference to FIG. 6, a dielectric layer 160 is formed over the structure of FIG. 5. The dielectric layer 160 may be formed of, for example, tetraethoxysilane (TEOS).

As shown in FIG. 6, contact holes 165 are formed in the dielectric layer 160 and filled with plug 170 (for example, a tungsten plug). In some embodiments, a conductive layer such as a Ti or TiN film may be formed on the sidewalls and bottom of the contact holes 165. Each contact hole 165 and corresponding plug 170 (and the conductive layer, if present) collectively forms an electrical contact providing electrical continuity to the etched interconnection layer 130'. The resulting structure of FIG. 6 constitutes a semiconductor device 20 (e.g., a MOS device) according to an embodiment of the inventive concept.

Referring to FIG. 6, the semiconductor device 20 includes the gate electrodes 115 formed on the semiconductor substrate 100 at a predetermined interval, with the spacers 110 formed on the sidewalls of the gate electrodes 115. The semiconductor device 20 also includes a portion of the etched interconnection layer 130' and a portion of the etched first hard mask layer 120' located above adjacent gate electrodes 115, as well as a portion of the etched interconnection layer 130' that is formed on the surface of the semiconductor substrate 100 and the sidewalls of the spacers 110 and located between adjacent gate electrodes 115. The semiconductor device 20 further includes an electrical contact (formed by the contact hole 165 and plug 170) formed on a portion of the etched interconnection layer 130' located between adjacent gate electrodes 115.

As shown in FIG. 6, the portion of the etched interconnection layer 130' formed on the semiconductor substrate 100 between adjacent gate electrodes 115 is in contact with the bottom surface of the electrical contact, and the portion of the etched interconnection layer 130' formed on the sidewalls of the spacers 110 is in contact with the lower side surfaces of the electrical contact. As a result, the semiconductor device 20 of FIG. 6 can provide more contact area between the electrical contact and the (etched) interconnection layer compared to a conventional semiconductor device (for example, the MOS device of FIG. 1). The increase in contact area allows the gate-to-gate distance of the semiconductor device 20 to be reduced without impacting current carrying capability. In contrast, a reduction in the gate-to-gate distance of a conventional semiconductor device may require a corresponding decrease in contact area (when the distance between adjacent edges of the spacers is less than the width of the electrical contact), which may subsequently result in lower current carrying capability. Thus, the semiconductor device 20 allows the predetermined interval of adjacent gate electrodes 115 to be less than that of a conventional semiconductor device (for example, the MOS device of FIG. 1) without impacting current carrying capability. Therefore, the semiconductor device 20 can enable greater scaling compared to conventional semiconductor devices.

Figure 7:
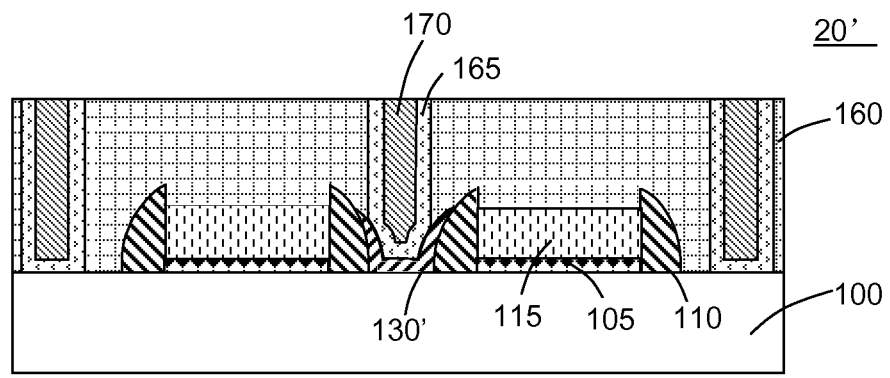
FIG. 7 is a cross-section view of a semiconductor device according to another embodiment of the inventive concept.

According to another embodiment of the inventive concept, the portion of the etched interconnection layer 130' and the portion of the etched first hard mask layer 120' located above adjacent gate electrodes 115 may be completely removed by a selective etch to form the semiconductor device 20' shown in FIG. 7. As shown in FIG. 7, a portion of the etched interconnection layer 130' that is formed near the top edges of the spacers 110 is also removed after the selective etch.

Referring to FIG. 7, the semiconductor device 20' includes the gate electrodes 115 formed on a semiconductor substrate 100 at a predetermined interval, with the spacers 110 formed on the sidewalls of the gate electrodes 115. The semiconductor device 20' also includes an etched interconnection layer 130' formed on the surface of the semiconductor substrate 100 and a portion of the sidewalls of the spacers 110 and located between adjacent gate electrodes 115. The semiconductor device 20' further includes an electrical contact (formed by the contact hole 165 and plug 170) formed on a portion of the etched interconnection layer 130' located between adjacent gate electrodes 115.

Figure 1:
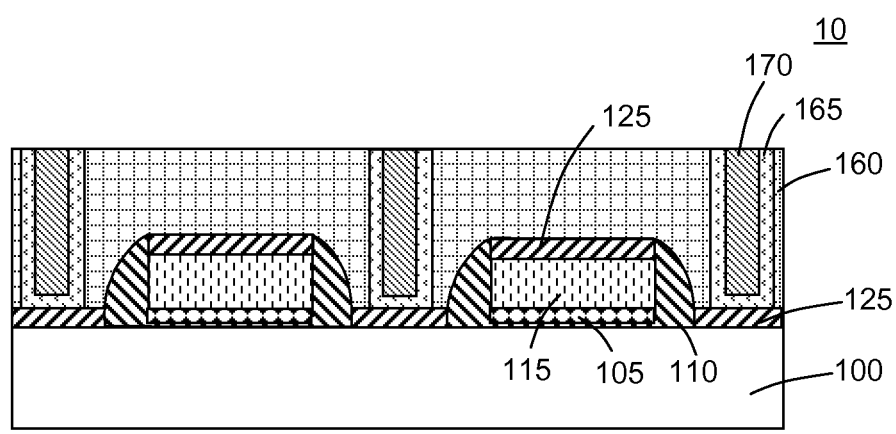
FIG. 1 is a cross-section view of a metal oxide semiconductor (MOS) device in the related art.

Similar to the semiconductor device 20 of FIG. 6, the semiconductor device 20' of FIG. 7 can provide more contact area between the electrical contact and the (etched) interconnection layer compared to the conventional MOS device of FIG. 1. Therefore, the semiconductor device 20' of FIG. 7 also provides scaling advantages similar to those previously described with reference to the semiconductor device 20 of FIG. 6.

One of ordinary skill in the art may recognize that the semiconductor device 20 of FIG. 6 provides a larger contact area between the electrical contact and the (etched) interconnection layer compared to the semiconductor device 20' of FIG. 7. As a result, wider process margins (e.g., lower alignment/etch accuracy) may be allowed in the fabrication of the semiconductor device 20, whereas stricter process margins (e.g., higher alignment/etch accuracy) may be required in the fabrication of the semiconductor device 20'.

Those skilled in the art would further appreciate that the semiconductor device 20 (or 20') may include a well region, a shallow trench isolation (STI), a source/drain region, and/or other semiconductor elements formed in the semiconductor substrate 100.

In some embodiments, the spacers 110 (and optionally, a portion of the top surface of the gate electrodes 115) may serve as a source/drain region to reduce the area of the device structure. The source/drain region may be further connected to the electrical contact through the etched interconnection layer 130'.

In some embodiments, a salicide layer may be formed on the top of the etched interconnection layer 130' and the gate electrodes 115 using a salicide process, the salicide layer for reducing contact resistance.

In some embodiments, the semiconductor device 20 (or 20') may be further provided with a protective cap layer (such as a SiN layer) on the gate electrodes 115 and the etched interconnection layer 130'.

Figure 8:
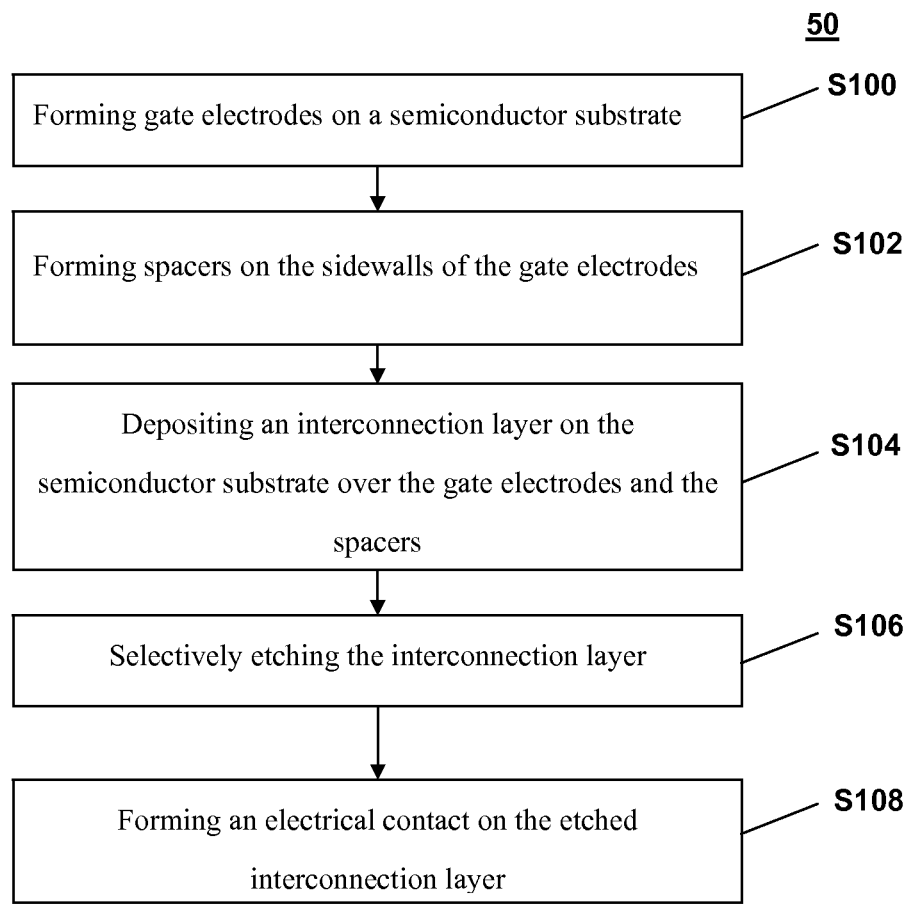
FIG. 8 is a flowchart of a method of fabricating a semiconductor device according to an embodiment of the inventive concept.

FIG. 8 is a flowchart of a method of fabricating a semiconductor device according to an embodiment of the inventive concept. In some embodiments, the method 50 in FIG. 8 may be used to fabricate the semiconductor device 20' of FIG. 7.

Referring to step S100 of FIG. 8, a plurality of gate electrodes (e.g., gate electrodes 115) are formed on a surface of a semiconductor substrate (e.g., semiconductor substrate 100) at a predetermined interval.

At step S102, spacers (e.g., spacers 110) are formed on the sidewalls of the gate electrodes.

At step S104, an interconnection layer (e.g., interconnection layer 130) is deposited conformally on the semiconductor substrate over the gate electrodes and the spacers.

At step S106, the interconnection layer is selectively etched such that at least a portion of the interconnection layer that is formed on the surface of the semiconductor substrate and the sidewalls of the spacers and located between adjacent gate electrodes, remains after the selective etch.

At step S108, an electrical contact (e.g., formed by a contact hole 165 and a plug 170) is formed on a portion of the etched interconnection layer located between adjacent gate electrodes.

With reference to the method 50 of FIG. 8, a portion of the etched interconnection layer formed on the semiconductor substrate between adjacent gate electrodes may be in contact with a bottom surface of the electrical contact, and a portion of the etched interconnection layer formed on the sidewalls of the spacers may be in contact with the lower side surfaces of the electrical contact. (See, e.g., semiconductor device 20' of FIG. 7). As a result, a semiconductor device formed using the method 50 may provide more contact area between the electrical contact and the (etched) interconnection layer, compared to a conventional semiconductor device (for example, the MOS device of FIG. 1). For reasons similar to those described with reference to FIGS. 6 and 7, the predetermined interval of adjacent gate electrodes of a semiconductor device formed using the method 50 can be less than that of an equivalent conventional semiconductor device, without impacting current carrying capability. Depending on the type of semiconductor devices, fabrication processes, and other factors, the predetermined interval of adjacent gate electrodes (of a semiconductor device formed using the method 50) may be reduced to different extents, thereby enabling further scaling of semiconductor devices.

In some embodiments of the method 50, a portion of the interconnection layer extending to the top of the gate electrodes remains after the selective etch S106, so as to provide a larger contact area between the electrical contact and the (etched) interconnection layer. The larger contact area may allow for wider process margins (e.g., lower alignment/etch accuracy) in the fabrication of the semiconductor device.

Figure 9:
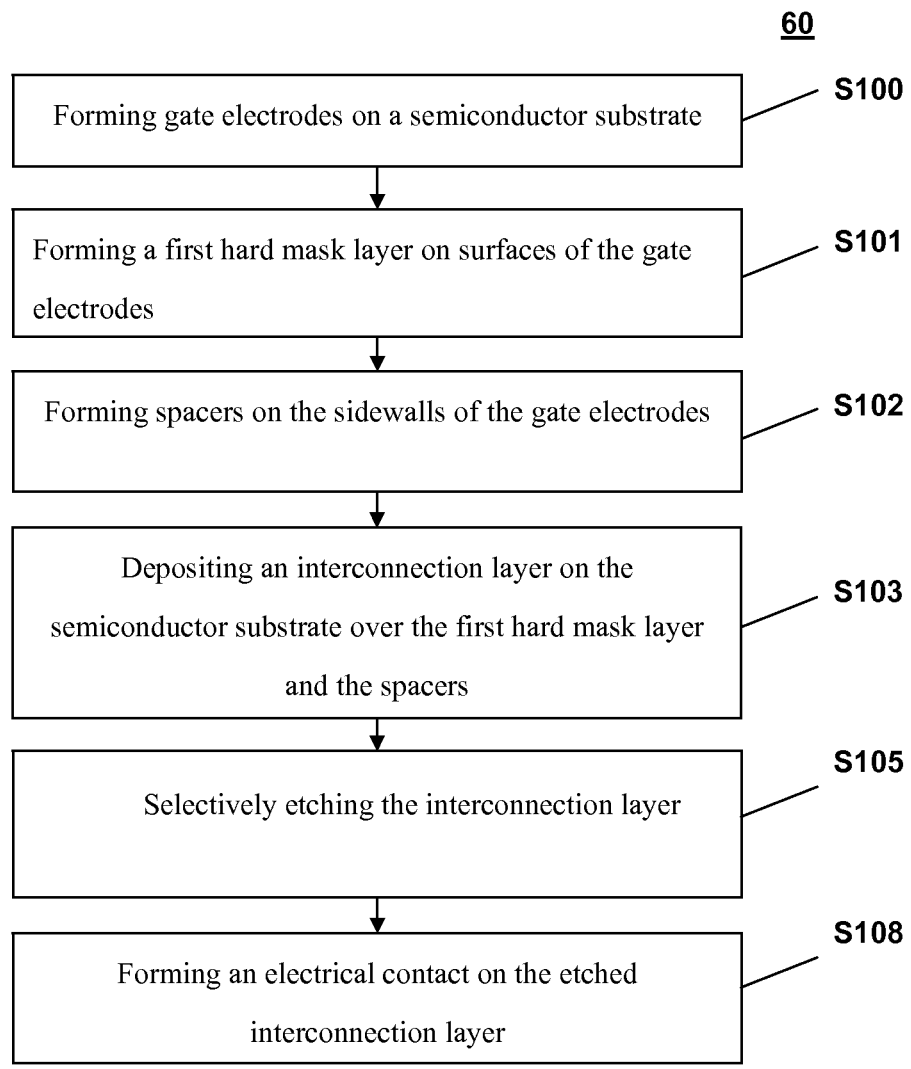
FIG. 9 is a flowchart of a method of fabricating a semiconductor device according to another embodiment of the inventive concept.

FIG. 9 is a flowchart of a method of fabricating a semiconductor device according to another embodiment of the inventive concept. In some embodiments, the method 60 in FIG. 9 may be used to fabricate the semiconductor device 20 of FIG. 6.

Referring to step S100 of FIG. 9, a plurality of gate electrodes (e.g., gate electrodes 115) are formed on a surface of a semiconductor substrate (e.g., semiconductor substrate 100) at a predetermined interval.

At step S101, a first hard mask layer (e.g., first hard mask layer 120) is formed on a surface of the gate electrodes.

At step S102, spacers (e.g., spacers 110) are formed on the sidewalls of the gate electrodes.

At step S103, an interconnection layer (e.g., interconnection layer 130) is deposited conformally on the semiconductor substrate over the first hard mask layer, gate electrodes, and spacers.

At step S105, the interconnection layer is selectively etched such that a portion of the interconnection layer and a portion of the first hard mask layer located above adjacent gate electrodes remain after the selective etch. In addition, a portion of the interconnection layer that is formed on the surface of the semiconductor substrate and the sidewalls of the spacers and located between adjacent gate electrodes, remains after the selective etch.

At step S108, an electrical contact (e.g., formed by a contact hole 165 and a plug 170) is formed on a portion of the etched interconnection layer located between adjacent gate electrodes.

In some embodiments of the method 60, a portion of the interconnection layer extending to the top of the gate electrodes remains after the selective etch S105, so as to provide a larger contact area between the electrical contact and the (etched) interconnection layer. The larger contact area may allow for wider process margins (e.g., lower alignment/etch accuracy) in the fabrication of the semiconductor device.

Similar to the method 50 of FIG. 8, the predetermined interval of adjacent gate electrodes of a semiconductor device formed using the method 60 of FIG. 9 can be less than that of a conventional semiconductor device, without impacting current carrying capability. Depending on the type of semiconductor devices, fabrication processes, and other factors, the predetermined interval of adjacent gate electrodes (of a semiconductor device formed using the method 60) may be reduced to different extents, thereby enabling further scaling of semiconductor devices.

As previously described, the method 60 in FIG. 9 may be used to fabricate the semiconductor device 20 of FIG. 6 in some embodiments, and the method 50 in FIG. 8 may be used to fabricate the semiconductor device 20' of FIG. 7 in some other embodiments. With reference to the semiconductor device 20 of FIG. 6 and the semiconductor device 20' of FIG. 7, one of ordinary skill in the art will appreciate that the method 60 may result in a larger contact area between the electrical contact and the (etched) interconnection layer compared to the method 50. As a result, wider process margins (e.g., lower alignment/etch accuracy) may be allowed in the method 60, whereas stricter process margins (e.g., higher alignment/etch accuracy) may be required in the method 50.

Examples of semiconductor devices and methods of fabricating the semiconductor devices according to different embodiments of the inventive concept have been described in detail in the foregoing description. Details well-known to those of ordinary skill in the art have not been described so as to avoid obscuring the inventive concept. Nevertheless, those skilled in the art would understand how to implement the disclosed technical solutions based on the above detailed description.

Although embodiments of the inventive concept have been described in detail, those skilled in the art would understand that the disclosed embodiments are only intended to be illustrative without limiting the scope of the present disclosure, and that the above embodiments can be modified without departing from the scope and spirit of the present disclosure.

What is claimed is:

1. A method of fabricating a semiconductor device, comprising:

forming a plurality of gate electrodes at a predetermined interval on a surface of a semiconductor substrate;

forming spacers on sidewalls of the gate electrodes;

depositing an interconnection layer conformally on the surface of the semiconductor substrate over the gate electrodes and the spacers;

selectively etching the interconnection layer, wherein at least a portion of the interconnection layer that is formed on the surface of the semiconductor substrate and sidewalls of the spacers and located between adjacent gate electrodes, remains after the selective etch, and wherein a portion of the gate electrodes is exposed to form an exposed portion of the gate electrodes after the selective etch of the interconnection layer;

forming a dielectric layer on the semiconductor substrate, the sidewalls of the spacers, and the exposed portion of the gate electrodes; and forming an electrical contact on the etched interconnection layer located between the adjacent gate electrodes, wherein the electrical contact is selectively formed on a portion of the etched interconnection layer located between adjacent laterally opposite spacers.

2. The method according to claim 1, further comprising:

forming a first hard mask layer on a surface of the gate electrodes, wherein the first hard mask layer is used as an etch stop layer during the selective etching of the interconnection layer.

3. The method according to claim 2, wherein the first hard mask layer is formed of a nitride, an oxide, or an oxynitride.

4. The method according to claim 1, further comprising:

forming a second hard mask layer on the interconnection layer, wherein the second hard mask layer is completely removed after the selective etching of the interconnection layer.

5. The method according to claim 4, wherein the second hard mask layer is formed of a nitride, an oxide, or an oxynitride.

6. The method according to claim 1, wherein selective etching the interconnection layer further comprises:

applying a layer of photoresist over the semiconductor substrate, performing a photolithographic process on the layer of photoresist to form a residual photoresist, and selectively etching the interconnection layer using the residual photoresist as an etch mask.

7. The method according to claim 1, wherein the interconnection layer is formed of a metal or polysilicon.

8. The method according to claim 1, wherein the interconnection layer has a thickness of about 300~400 Å.

9. A method of fabricating a semiconductor device, comprising:

forming a plurality of gate electrodes at a predetermined interval on a surface of a semiconductor substrate;

forming a first hard mask layer on a surface of the gate electrodes;

forming spacers on sidewalls of the gate electrodes;

depositing an interconnection layer conformally on the surface of the semiconductor substrate over the first hard mask layer, the gate electrodes, and the spacers;

selectively etching the interconnection layer, wherein a portion of the interconnection layer and a portion of the hard mask layer located above adjacent gate electrodes remain after the selective etch, and a portion of the interconnection layer that is formed on the surface of the semiconductor substrate and sidewalls of the spacers and located between the adjacent gate electrodes remains after the selective etch, and wherein a portion of the gate electrodes is exposed to form an exposed portion of the gate electrodes after the selective etch of the interconnection layer;

forming a dielectric layer on the semiconductor substrate, the sidewalls of the spacers, and the exposed portion of the gate electrodes; and forming an electrical contact on the etched interconnection layer located between the adjacent gate electrodes, wherein the electrical contact is selectively formed on a portion of the etched interconnection layer located between adjacent laterally opposite spacers.

10. The method according to claim 9, wherein the selective etching further comprises:

applying a layer of photoresist over the semiconductor substrate, performing a photolithographic process on the layer of photoresist to form a residual photoresist, and selectively etching the interconnection layer using the residual photoresist as an etch mask.

11. The method according to claim 9, wherein the interconnection layer is formed of a metal or polysilicon.

12. The method according to claim 11, wherein the interconnection layer has a thickness of about 300~400 Å.

\* \* \* \* \*